United States Patent
Barr et al.

[11] Patent Number: 6,163,197
[45] Date of Patent: *Dec. 19, 2000

[54] LOW NOISE METHOD FOR INTERCONNECTING ANALOG AND DIGITAL INTEGRATED CIRCUITS

[75] Inventors: Keith Barr; Frank Thomson, both of Los Angeles, Calif.

[73] Assignee: Alesis Semiconductor, Inc., Los Angeles, Calif.

[*] Notice: This patent is subject to a terminal disclaimer.

[21] Appl. No.: 09/370,886

[22] Filed: Aug. 10, 1999

Related U.S. Application Data

[63] Continuation of application No. 08/961,067, Oct. 30, 1997, Pat. No. 5,969,562.

[51] Int. Cl.[7] .................................................. H03K 17/16
[52] U.S. Cl. ........................................... 327/319; 327/333
[58] Field of Search ................................... 327/564, 565, 327/306, 309, 315, 318, 319, 333; 326/80, 21, 62, 63

[56] References Cited

U.S. PATENT DOCUMENTS

| | | | |
|---|---|---|---|
| 4,910,515 | 3/1990 | Iwamatsu | 341/110 |
| 5,506,851 | 4/1996 | Fuse | 371/22.1 |
| 5,630,221 | 5/1997 | Birleson | 455/249.1 |
| 6,014,065 | 1/2000 | Nishkawa | 332/103 |

*Primary Examiner*—Tuan T. Lam
*Attorney, Agent, or Firm*—Finnegan, Henderson, Farabow, Garrett & Dunner, L.L.P.

[57] ABSTRACT

An apparatus and method for interconnecting digital and analog circuitry on separate substrates within a single integrated chip package attenuates logic level signals on one substrate, transmits the attenuated signals to another substrate, and amplifies the attenuated signals back to logic level signals.

4 Claims, 4 Drawing Sheets

LOW NOISE METHOD FOR INTERCONNECTING ANALOG AND DIGITAL INTEGRATED CIRCUITS

This is a continuation of application Ser. No. 08/961,067, filed Oct. 30, 1997 now U.S. Pat. No. 5,969,562 which is incorporated herein by reference.

BACKGROUND

The present invention relates generally to interconnecting analog and digital integrated circuits and, more particularly, to interconnecting such in a manner that reduces noise.

Analog electrical signals are often processed by digital computational circuitry. This requires converting the analog signal into a stream of discrete numerical values, in other words, a digital signal. This conversion typically takes place in an analog to digital (A/D) converter that periodically samples the analog signal and represents those samples with digital values. To convert digital signals back to analog signals requires a digital to analog (D/A) converter.

The digital circuits that process digital signals, however, generate noise that can interfere with the A/D and D/A conversion processes. This interference can lead to decreased accuracy or erroneous conversions. When low accuracy for such conversions will suffice, the converter circuits and the computational circuits can coexist on the same integrated circuit substrate. Where higher accuracy is required, however, the single substrate technique proves to be inadequate because of the noise produced by the digital circuits.

Currently, circuits for applications requiring high accuracy address this noise problem by the configuration in FIG. 1, which incorporates two separate integrated circuit devices, with separate substrates, into a single package. A substrate 10 contains analog circuitry 12, while a separate substrate 11 contains digital circuitry 13. The two substrates 10 and 11 are interconnected via traditional lead bonding wires 15. The lead bonding wires 15 are connected to substrates 10 and 11 through bonding pads 14. In the alternative, bonding wires 15 can be bonded from one substrate to a stationary lead frame element, and then from that element to the other substrate. These interconnections carry binary signals of the logic levels required by the logic circuit.

Unfortunately, this configuration does not eliminate interference from digital signals needed for conversion of signals. For D/A converters, data must be transferred from the digital circuit to the analog circuit, and for A/D converters, data must be transferred from the analog circuit to the digital circuit. Also, clock signals that drive the converters and synchronize the transfer of data between the analog and digital circuits are digital signals. These data and clock signals are carried by interconnect bonding pads on the analog circuit substrate. The bonding pads are capacitively coupled with the underlying substrate enough to allow the digital signals to create noise and interfere with the conversion process.

The bonding pad to substrate coupling problem is further aggravated by two factors. First, the advent of fine line lithography has made the conducting, insulating, and semiconducting features of the devices extremely small (fractions of a micron), while lead bonding technology continues to require comparatively large bonding pads (10,000 square microns in area). As this trend continues, the relative influence of bonding pad signals into the circuit substrate increases. Second, all circuits must have static protection circuits connected from the bonding pads to the substrate to protect against static discharge during packaging. These static protection circuits aggravate the bonding pad-to-substrate coupling problem.

In the particular case of a converter using switched capacitor, delta sigma conversion techniques, noise is also caused by the associated decimation filter. In that case, a very high clock frequency is used to sample both the analog input voltage and a reference voltage at the input of a switched capacitor filter. After each high frequency cycle, a comparator ascertains whether the filter output is positive or negative. The polarity of the reference potential on the next cycle is then determined by the output of the comparator. The converters output a single bit on each high frequency clock cycle and use a digital decimation filter to reduce the sample rate while increasing the resulting low sample frequency accuracy. A typical delta sigma converter capable of converting frequencies up to 20 kilohertz requires a 3.072 megahertz high frequency clock. The decimation filter, in turn, would output 16 bit samples at 48 kilohertz. For this typical case, the noise produced by the decimation filter can, if not properly isolated from the analog circuitry, reduce the accuracy of the sampled signals in the switched capacitor section, causing a loss of conversion accuracy.

In light of the foregoing, there is a need to interconnect signals between analog conversion devices and digital processing devices in a manner that reduces the noise coupled into the substrate of circuits.

SUMMARY OF THE INVENTION

Accordingly, methods and apparatus consistent with the present invention for interconnecting analog and digital circuitry within an integrated circuit reduce the effects of noise on the analog circuitry. These methods and apparatus provide increased accuracy in applications requiring a higher degree of precision.

Additional features and advantages of such methods and apparatus will be set forth in the description which follows, and in part will be apparent from the description, or may be learned by their practice.

To achieve these and other advantages, a method consistent with this invention for interconnecting analog and digital circuitry within an integrated circuit includes receiving signals at predetermined levels from one of the circuitries, attenuating the received signals, transmitting the attenuated signals to the other one of the circuitries, receiving the attenuated signals at the other one of the circuitries, and restoring the attenuated signals to signals at the predetermined, logic levels.

An apparatus consistent with this invention includes an analog portion of an analog to digital converter on a first substrate that outputs signals at predetermined, a signal attenuator coupled to the analog portion to attenuate the outputted signals, a signal amplifier on a second substrate coupled to the signal attenuator to amplify the attenuated signals into signals at the predetermined, and digital logic circuitry to receive the amplified signals from the signal amplifier.

In another aspect, an apparatus consistent with this invention includes digital logic circuitry, on a first substrate, that outputs signals at the predetermined levels, a signal attenuator, coupled to the digital logic circuitry, for attenuating the outputted signals, a signal amplifier, on a second substrate and coupled to the signal attenuator, for amplifying the attenuated signals into level signals at the predetermined levels, and an analog portion of a digital-to-analog converter for receiving the amplified signals from the signal amplifier.

Both the foregoing general description and the following detailed description are exemplary and explanatory and do not restrict the invention as claimed. The accompanying drawings, which are incorporated in and constitute a part of this specification, illustrate embodiments consistent with the invention and, together with the description, explain the certain underlying principles.

DESCRIPTION OF THE PREFERRED EMBODIMENT

Reference will now be made in detail to the preferred embodiments consistent with the invention. Examples are illustrated in the accompanying drawings. Where possible, like numerals are used to refer to like or similar components.

Because the coupling between the bonding pads and their associated circuitry to the substrate is a major source of noise and interference for conversion circuitry, systems and methods consistent with the present invention minimize the influence of the bonding pad signals on the circuit substrate using low voltage signal levels and differential techniques. Since signal levels in this invention are much lower than traditional logic levels, differential input amplifiers on the receiving end of the interconnection reconstruct the signals back to preset logic levels. Typically, a peak differential signal level on the order of tens of millivolts is adequate for conducting such signals, with a reduction of noise conducted to substrate of 40 to 60 decibels over traditional approaches. However, even a reduction of the logic level signals to one-third of their values can result in significant noise reduction.

Figure 2:
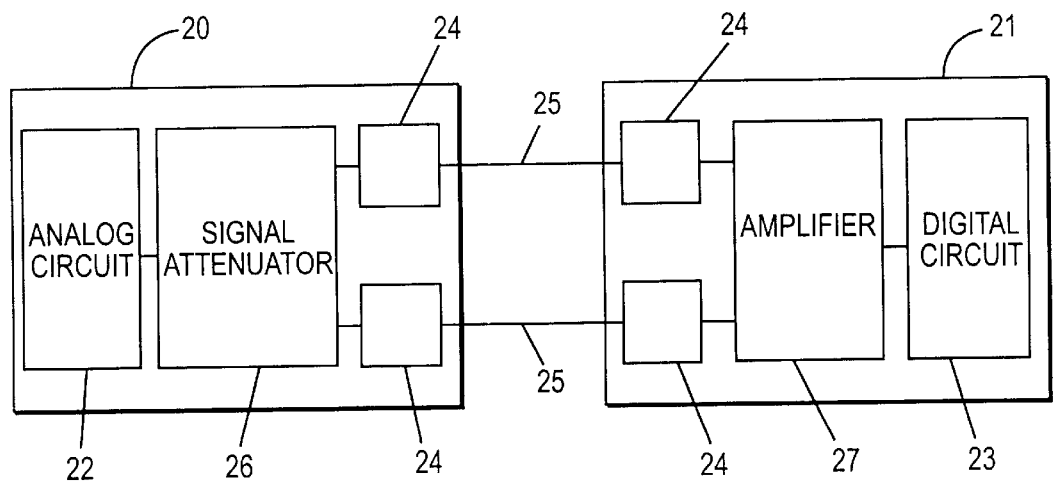
FIG. 2 is a drawing of a configuration for connecting analog and digital circuits on separate substrates consistent with the present invention.

A configuration using this technique is shown generally in FIG. 2. Substrate 20 contains analog circuitry 22. The logic level signals output by analog circuitry 22 pass through signal attenuator 26 to bonding pads 24. The attenuated signals are sent over bonding wires 25 to bonding pads 24 located on a separate substrate 21. The attenuated signals are then amplified back to logic level signals by amplifier 27 and passed to digital circuitry 23. This scheme, of course, is equally applicable where the digital circuitry sends signals to the analog circuitry. In that case, signal attenuator 26 would take the place of amplifier 27, and vice versa.

Figure 3:
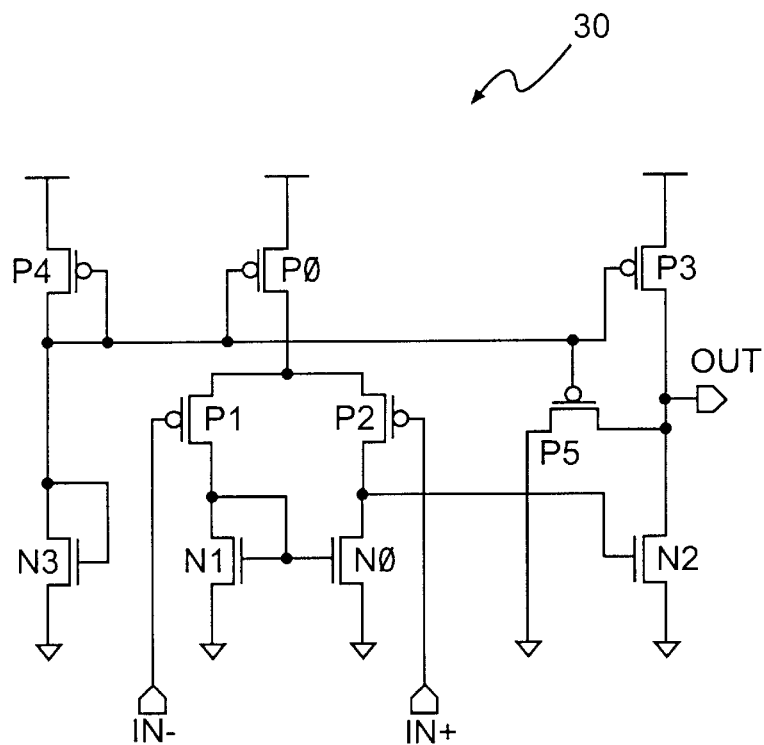
FIG. 3 is a circuit diagram of a signal amplifier consistent with the present invention.

A typical level-restoring amplifier suitable for use as amplifier 27 in FIG. 2 is shown in FIG. 3. The amplifier 30, constructed with CMOS technology, can amplify a low level differential signal in the range of approximately −0.2 volts to +3 volts to a logic level signal. In amplifier 30, NMOS device N3 sets a bias current through PMOS device P4 that establishes a bias voltage to the gate terminals of devices P0 and P3. Device P0, having the same bias as device P4, mirrors the bias current into devices P1 and P2, which distribute the current into load devices N0 and N1 depending on the differential input voltage input to the gate terminals of devices P1 and P2. If the voltage on the in+terminal is more positive than on the in−terminal, device P1 will divert more current toward device N1, and the voltage at the source terminal of device N0 will fall, turning device N2 off and allowing the output to rise toward the supply potential. If the voltage on the in+terminal is less positive than on the in−terminal, device P2 will divert more current toward device N0, causing the voltage at the drain terminal of device N0 to rise, turning device N2 on, thus pulling the output to ground.

Although amplifier 30 could stand alone as a reasonable receiving device for low level differential signals, the inclusion of PMOS device P5 adds a desirable feature to the receiving amplifier design. Especially in those cases where the receiving amplifier is located on the sensitive analog substrate, the inclusion of device P5 allows the amplifier to draw continuous supply current, independent of the amplifier output state. This feature is provided by design the gate W/L ratio of device P5 substantially greater than the W/L ratio of device P3. In operation, when the output is a logical one with the amplifier output at the supply potential, device N2 is effectively off, and the current through device P3 falls to zero. If device P5 were not present, the total supply current would fall, causing the total current draw for the analog circuit to be less when the amplifier is outputting a one than when it is outputting a zero. Such supply current variations can cause deleterious effects on the performance of sensitive analog circuits supplied from the same power supply source. Device P5 acts as a clamp, limiting the maximum positive output swing to slightly less than full supply potential, and diverting P3's output current to ground when the amplifier is outputting a logical one.

Although the specific amplifier 30 has been herein described in some detail, it should be noted that other low signal amplifiers well known in the art could also be used.

Figure 1:
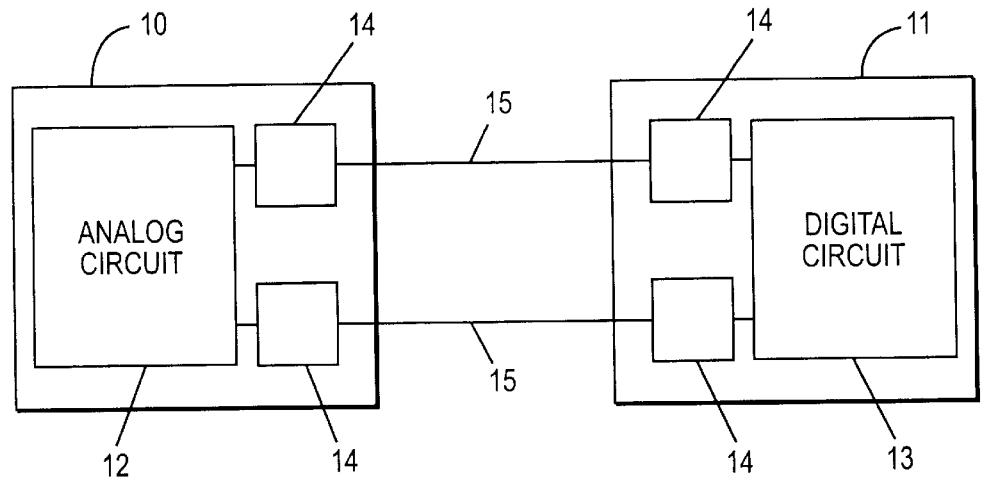
FIG. 1 is a drawing of the prior art configuration for connecting analog and digital circuits on separate substrates.
Figure 4:
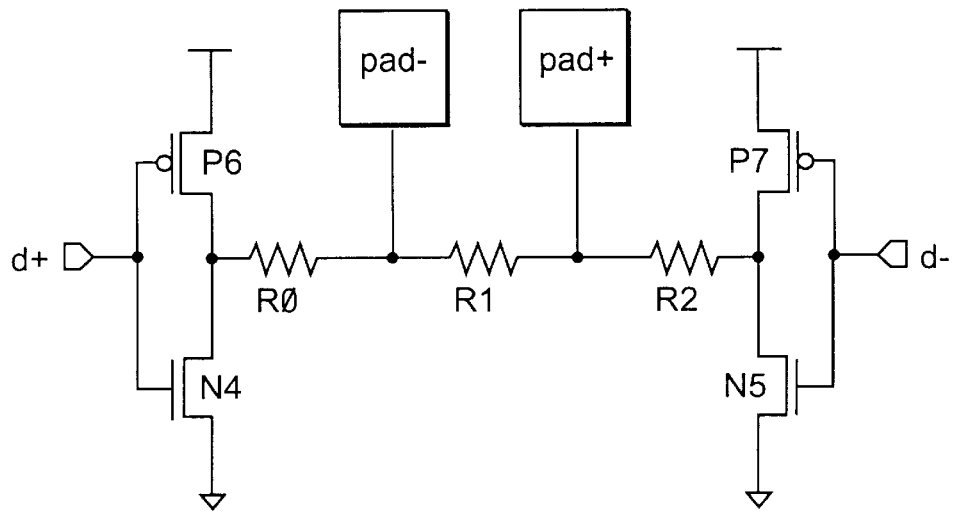
FIG. 4 is a circuit diagram of a signal attenuator consistent with the present invention.

There are several techniques that can be used to attenuate logic level signals into low level differential signals. The circuit of FIG. 4 illustrates one method of deriving low differential potentials suitable for driving a pair of bonding pads (pad− and pad+) at the transmitting end of an interconnect intended to couple to an amplifier like the one shown in FIG. 3. Signals d+and d− are complementary logic signals intended to be conveyed through the interconnection. The circuit includes devices N4, N5, P6 and P7, which act as inverting drivers to a resistor array consisting of resistors R0, R1, and R2. These three resistors are chosen to attenuate the differential signals to the tens of millivolts level, while presenting a driving resistance to the bonding pads sufficiently low to cause, in conjunction with the associated capacitance of the pads, acceptable signal transition time delay. This approach delivers a common mode voltage to the receiving amplifier of approximately one-half of the supply voltage, which is well within the common mode range of the receiving amplifier of FIG. 1.

The design of FIG. 4, however, has some drawbacks. Slight variations in resistor matching, for example, cause the average voltage of the two pads to differ between the zero and one output states. Further, to minimize the current consumption of the driver circuit, resistors R0 and R2 must be inconveniently large. Finally, supply current spikes will be drawn at the instant the data changes, due to the simultaneous conduction of the driving devices. Although the driving devices could be made intentionally small to minimize this current, resistors R0 and R2 would have to be made correspondingly large to accommodate the resulting small conducted currents, and the resulting time constants could be prohibitively large.

Figure 5:
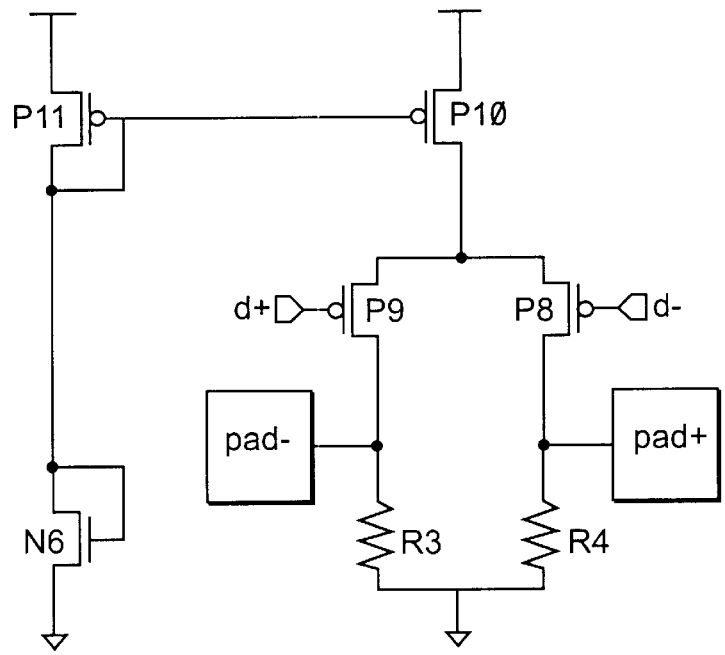
FIG. 5 is a circuit diagram of another signal attenuator consistent with the present invention.

An improved circuit is illustrated in FIG. 5. In that circuit, device N6 supplies a bias current to device P1 where a bias voltage is generated and applied to P10. Device P10 supplies a constant current through differential switches P8 and P9 to the pads (pad− and pad+) and to resistors R3 and R4. The current drawn from the supply can be very constant and small, for example, 5 uA. The size of resistors R3 and R4 can be reasonable, for example 10 Kohms. In this circuit, the average common mode voltage supplied to the receiving amplifier is +25 millivolts, which is within its common mode range. Advantages of this circuit include a constant supply current, the opportunity to use very small differential devices P8 and P9 which, in turn, present a minimal load to the driving logic circuits, and freedom of supply impulses when the transmitted data switches state.

Figure 6:
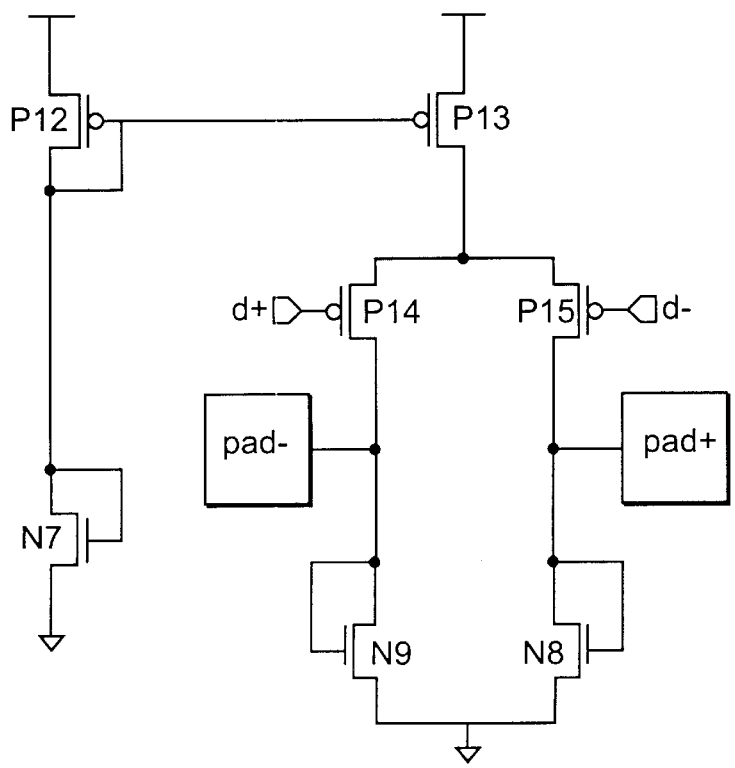
FIG. 6 is a circuit diagram of yet another signal attenuator consistent with the present invention.

FIG. 6 illustrates another variation on a signal attenuator. The circuit is similar to that of FIG. 5, except that a pair of NMOS devices N8 and N9, each with drain and gate terminals connected, are used in place of resistors R3 and R4. The gate dimensions of devices N8 and N9 are chosen so that the devices exhibit the required resistance. This circuit has an advantage over the circuit of FIG. 5 in that the common mode voltage is on the order of +1volt, well within the input common mode range of the receiving amplifier of FIG. 1. On the other hand, this circuit has a disadvantage in that the voltage across device N8 or N9, whichever carries no current, will ultimately fall to zero causing a larger differential voltage than is required.

Figure 7:
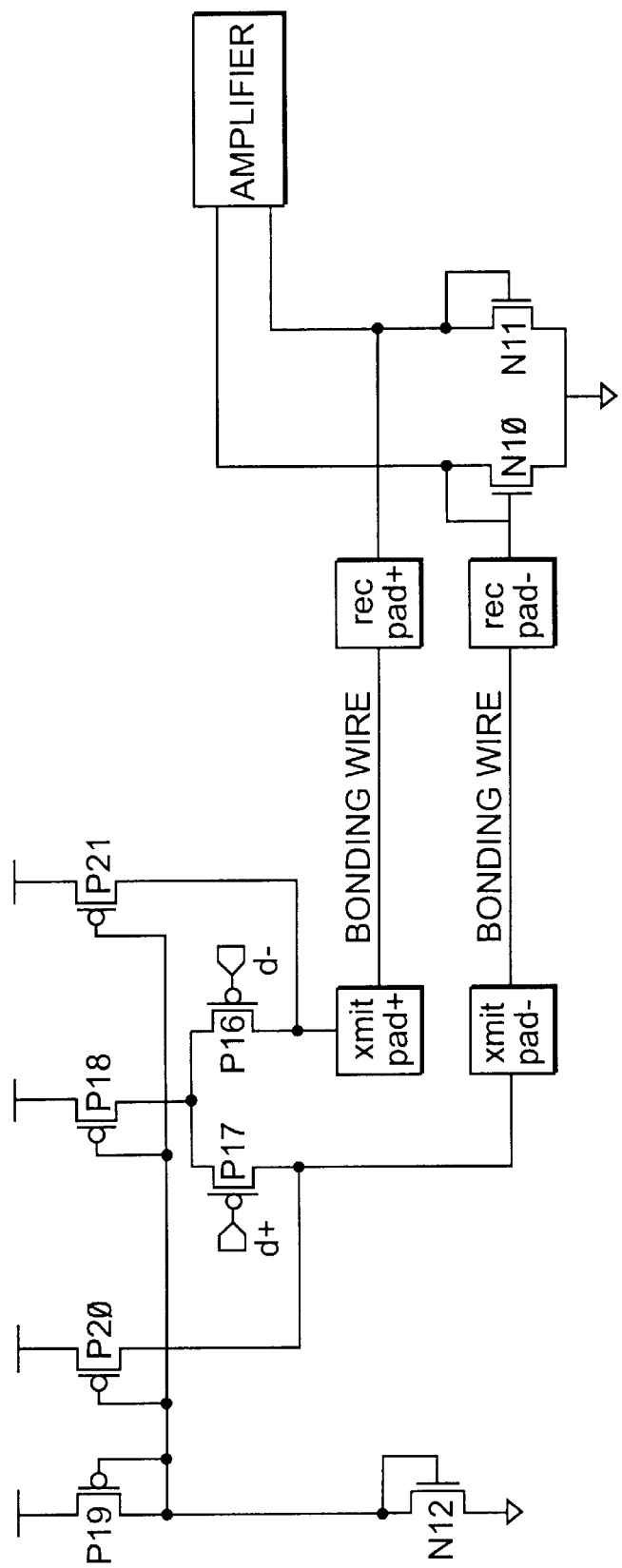
FIG. 7 is a circuit diagram of still another signal attenuator consistent with the present invention.

FIG. 7 is a block diagram of a device illustrating a solution to this problem. In this case, load devices N10 and N11 are optionally placed at the receiving end of the interconnect. Extra current source devices P20 and P21 are used to ensure that the current through the load devices N10 and N11 never falls to zero.

It will be apparent to those skilled in the art that various modifications and variations can be made in the systems and methods consistent with the present invention without departing from its spirit or scope. The present invention covers the modifications and variations of this invention provided they come within the scope of the appended claims and their equivalents.

What is claimed is:

1. A method for interconnecting analog circuitry and digital circuitry within an integrated circuit, comprising the steps of:

receiving signals at predetermined levels from one of the circuitries on a first substrate;

attenuating the received signals;

transmitting the attenuated signals to the other one of the circuitries on a second substrate;

restoring the attenuated signals to signals at the predetermined levels; and receiving the restored signals at the other one of the circuitries.

2. The method of claim 1 wherein the step of attenuating the received signals includes the step of:

attenuating the received signals to at most one-third of their value.

3. The method of claim 1 wherein the step of receiving signals includes the step of:

receiving signals from the digital circuitry.

4. The method of claim 1 wherein the step of restoring the attenuated signals includes the step of:

restoring the attenuated signals using a differential amplifier wherein the supply current is substantially constant regardless of the output of the amplifier.

* * * * *